United States Patent
Nakamura

[11] Patent Number: 5,808,520
[45] Date of Patent: Sep. 15, 1998

[54] ATTENUATING CIRCUIT USING QUARTER-WAVE LINES

[75] Inventor: Taisuke Nakamura, Tokyo, Japan

[73] Assignee: NEC Corporation, Tokyo, Japan

[21] Appl. No.: 612,311

[22] Filed: Mar. 7, 1996

[30] Foreign Application Priority Data

Mar. 22, 1995 [JP] Japan .................................. 7-062818

[51] Int. Cl.⁶ .................................................. H01P 1/22
[52] U.S. Cl. ..................................... 333/81 A; 333/81 R
[58] Field of Search ................................ 333/81 A, 81 R

[56] References Cited

FOREIGN PATENT DOCUMENTS

| 0044314 | 3/1982 | Japan | 333/81 R |
| 0049413 | 2/1989 | Japan | 333/81 R |
| 1-74643 | 5/1989 | Japan . | |
| 1345275 | 10/1987 | U.S.S.R. | 333/81 R |

Primary Examiner—Robert Pascal
Assistant Examiner—Barbara Summons
Attorney, Agent, or Firm—Young & Thompson

[57] ABSTRACT

A first bypass capacitor and a second bypass capacitor are connected in series between an input terminal and an output terminal for high frequency signals. A quart-wave line and a diode are connected between the connecting point of the first and second bypass capacitors and the ground, and a choke coil is connected between the connecting point and a D.C. voltage input terminal. When input signals are not to be attenuated, a D.C. voltage is fed from the D.C. voltage input terminal, and no D.C. voltage is fed when the signals are to be attenuated.

3 Claims, 3 Drawing Sheets

ATTENUATING CIRCUIT USING QUARTER-WAVE LINES

BACKGROUND OF THE INVENTION

The present invention relates to an attenuating circuit, and more particularly to an attenuating circuit using a quarter-wave line or lines.

A quarter-wave line (hereinafter referred to simply as "line") is an electronic element comprising a strip line and other sub-elements. When one end of the line is short-circuited and the line length is ¼ of the wave length of input signals, the impedance from the other end is made infinite. Conversely, when one end of the line is opened, the impedance from the other end becomes zero.

Electronic circuits using such lines include, for instance, a circulator with a limiter circuit (hereinafter referred to simply as "limiter") disclosed in the Gazette of the Japan Utility Model Laid-open No. Heisei-1-74643, published May 19, 1989.

This limiter has a circulator, three ¼ Q-section transformers (equivalent to quarter-wave lines), and two Schottky barrier diodes of which one end is grounded and the other end is connected to the input/output terminals of one of the quarter-wave transformers.

The limiter clips the voltages of input signals with threshold voltages of the two Schottky barrier diodes in the forward and backward directions. Therefore, the limiter can supply signal voltages within a certain range determined by the threshold voltages of the Schottky barrier diodes in the forward and backward directions.

However, since this limiter clips the voltages of input signals with the threshold voltages of the Schottky barrier diodes, harmonic signals, i.e. distortions, arise in its output signals. These distortions are entered as harmonic content into an electronic circuit downstream from the limiter, for instance a frequency mixer in a receiver, and destabilizes the output frequency of the frequency mixer. Therefore, a filter is needed between the limiter and the frequency mixer to remove the harmonic content, posing disadvantages in cost-effectiveness and mounting space.

SUMMARY OF THE INVENTION

An object of the present invention is to provide an attenuating circuit and a method for controlling the attenuating circuit using a quarter-wave line or lines whose output contains no harmonic content.

Another object of the invention is to provide an attenuating circuit and a method for controlling the attenuating circuit using a quarter-wave line or lines whose circuitry is simplified.

In order to achieve the aforementioned objectives, an attenuating circuit according to the invention has a quarter-wave line between the connecting point of input and output terminals for high frequency input signals and the ground, and a control circuit to open or short-circuit the impedance as viewed from the end of the quarter-wave line on the connecting point side.

It is desirable for this control circuit to have a diode inserted between the quarter-wave line and the ground and to open or short-circuit the impedance depending on whether or not a D.C. is supplied to the diode via the quarter-wave line.

A method of controlling an attenuating circuit having a quarter-wave line and a diode has the steps of outputting a signal obtained by attenuating an input signal when a D.C. voltage is supplied to the diode, and outputting the input signal as it is when the D.C. voltage is not supplied to the diode.

A method of controlling an attenuator having a quarter-wave line, the method has the steps of providing a controlling signal to the quarter-wave line, controlling an impedance viewed from a ground connected to one end of the quarter-wave line based on the a level of the control signal, and supplying an output terminal with one of a first signal having almost the same level of an input signal and a second signal having a predetermined attenuating level, in response to the impedance of the quarter-wave line.

In the above-described configuration, when the D.C. is fed to the diode, the voltage of the input signals entered from the input terminal is outputted as it is, with its amplitude unattenuated, from the output terminal. On the other hand, when no D.C. voltage is fed to the diode, the input signals entered from the input signal flow to the ground via the quarter-wave line. However, because of the finiteness of the sharpness Q of the quarter-wave line, part of the input signals does not flow to the quarter-wave line but is outputted from the output terminal. Accordingly, the voltage of the input signals at the output terminal has undergone amplitude attenuation.

BRIEF DESCRIPTION OF THE DRAWINGS

These and other objects, features and advantages of the present invention will become more fully apparent from the following detailed description when taken in conjunction with the accompanying drawings, wherein.

DETAILED DESCRIPTION OF THE PREFERRED EMBODIMENTS

Figure 1:
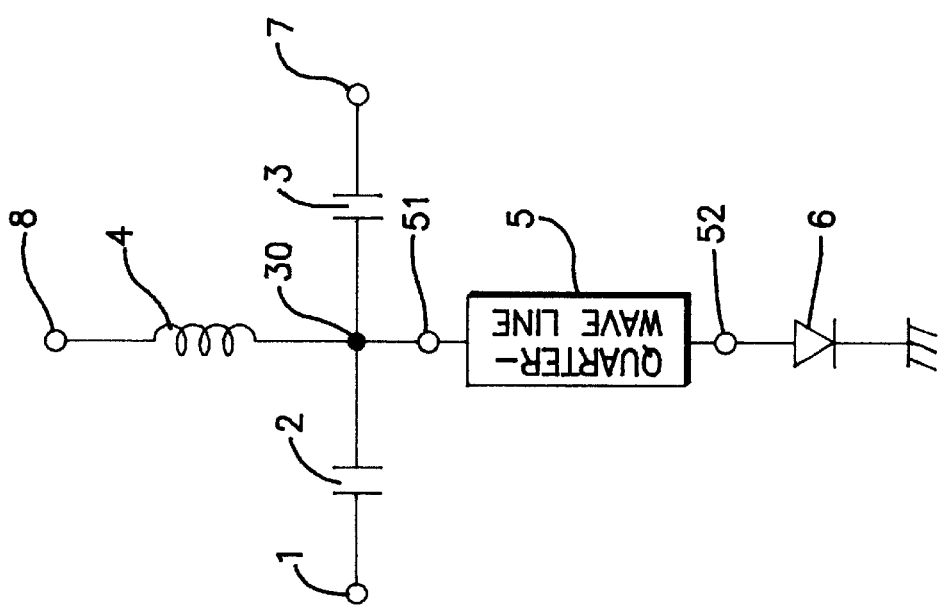
FIG. 1 illustrates a preferred embodiment of the invention, which is an attenuating circuit using a quarter-wave line.

Referring to FIG. 1, a first bypass capacitor 2 and a second bypass capacitor 3 are connected in series between an input terminal 1 and an output terminal 7. A choke coil 4 is connected in series between the connecting point 30 between the first and second bypass capacitors 2 and 3 and a D.C. voltage input terminal 8. One end of a quarter-wave line (hereinafter referred to simply as "line") 5 is connected to the connecting point 30 through a terminal 51, and the other end of the line 5 is connected to a diode 6 through a terminal 52. The anode of the diode 6 is connected to the other end of the line 5 through the terminal 52, and the cathode of the diode 6 is grounded. The length of the line 5 is ¼ of the wavelength of the input signals from the input terminal 1. When one end of the line 5 is short-circuited, the impedance from the other end becomes infinite. Conversely, when one end of the line 5 is opened, the impedance from the other end becomes zero.

Next will be described the operation of the circuit of FIG. 1 with reference to FIGS. 2(a) to 2(b) and 3(a) to 3(b).

Figure 2A:
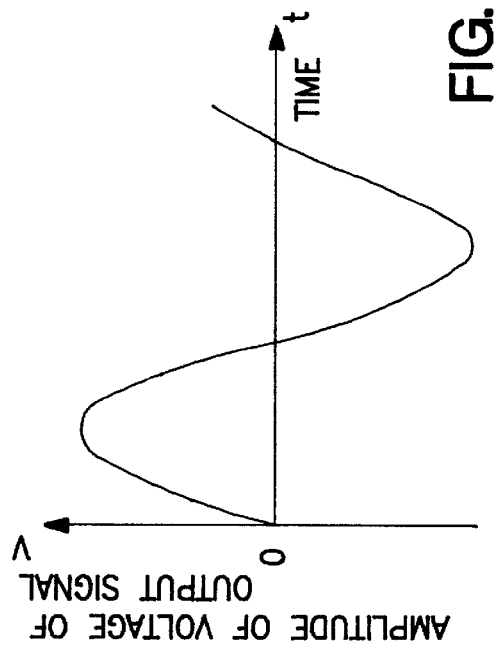
FIGS. 2(a) to 2(b) illustrate the characteristics of the voltage of input/output signals when a D.C. voltage is fed to the attenuating circuit shown in FIG. 1.
Figure 2B:
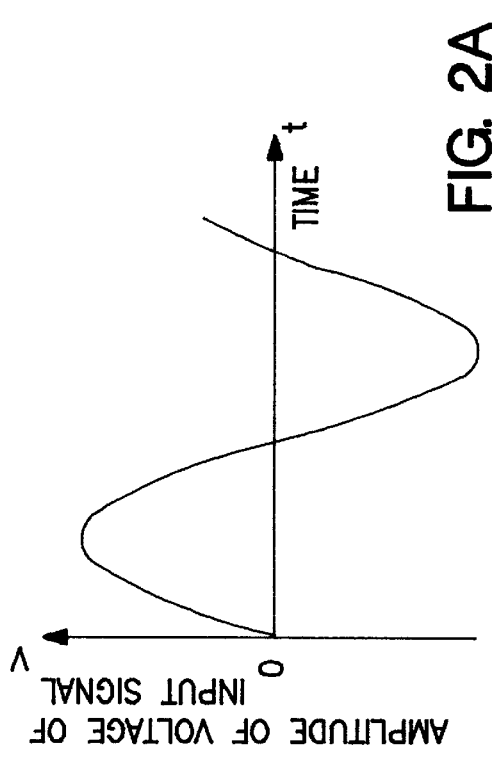

FIGS. 2(a) to 2(b) illustrate the characteristics of the variations over time of the amplitude of the voltage of the input/output signals of the attenuating circuit when a D.C. voltage, or control signal, is supplied to the D.C. voltage input terminal 8. FIG. 2(a) refers to the input signal to the input terminal 1 and FIG. 2(b), to the output signal from the output terminal 7.

If a D.C. voltage is fed from the D.C. voltage input terminal 8 when such an input signal as shown in FIG. 2(a) is entered to the input terminal 1, the D.C. flows to the ground via the choke coil 4, the line 5 and the diode 6, which is turned on as a result. As the turned-on diode 6 short-circuits the terminal 52 of the line 5, the impedance at the terminal 51 of the line 5 becomes infinite, and no input signal from the input terminal 1 flows to the line 5. Accordingly, the input signals are supplied as they are to the output terminal 7 via the first and second bypass capacitors 2 and 3, and the amplitude of the voltage of the output signals, as shown in FIG. 2(b), becomes equal to that of the voltage shown in FIG. 2(a).

Incidentally, the D.C. from the D.C. voltage input terminal 8 is prevented by the bypass capacitors 2 and 3 from flowing to the input terminal 1 and the output terminal 7, and the A.C. component of the input signals is prevented by the choke coil 4 from flowing to the D.C. voltage terminal 8.

Figure 3A:
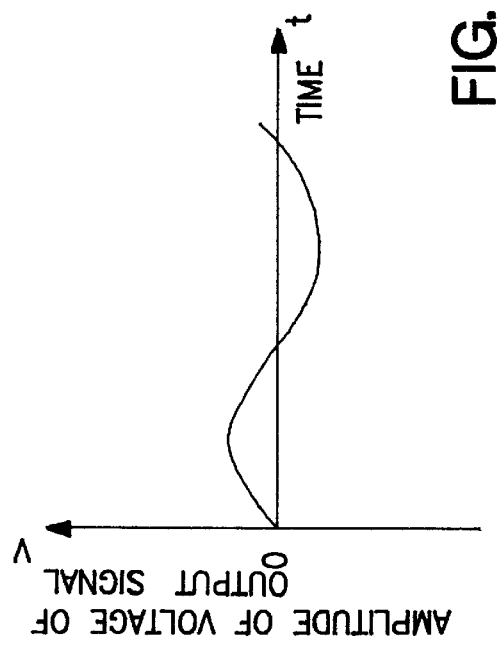
FIGS. 3(a) to 3(b) illustrate the characteristics of the voltage of input/output signals when a D.C. voltage is not fed to the attenuating circuit shown in FIG. 1.
Figure 3B:
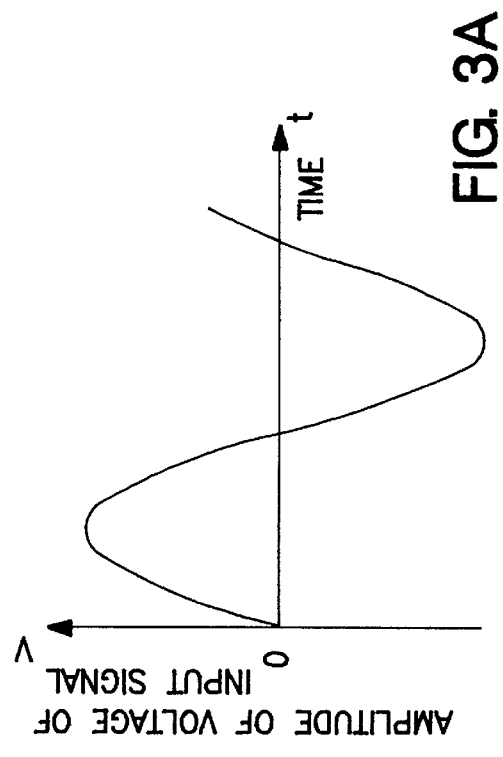

FIGS. 3(a) to 3(b) illustrate the characteristics of the variations over time of the amplitude of the voltage of the input/output signals of the attenuating circuit when no D.C. voltage is supplied to the D.C. voltage input terminal 8. FIG. 3(a) refers to the input signal to the input terminal 1 and FIG. 3(b), to the output signal from the output terminal 7.

If no D.C. voltage is fed from the D.C. voltage input terminal 8 when such an input signal as shown in FIG. 3(a) is entered to the input terminal 1, the diode 6 is turned off to open the terminal 52 of the line 5. Accordingly, the impedance of the terminal 51 of the line 5 becomes zero, and input signals from the input terminal 1 flow to the ground via the first bypass capacitor 2, the line 5 and diode 6.

When the input signals flow to the ground, theoretically no output signal is supposed to be supplied from the output terminal 7, but, as the sharpness Q of the line 5 is finite, the impedance of the terminal 51 of the line 5 is not exactly zero. Accordingly, part of the input signals is outputted as it is from the output terminal via the second bypass capacitor 3 instead of flowing to the line 5 with the result that the amplitude of the voltage of the output signals is such as shown in FIG. 3(b).

Next will be described another preferred embodiment of the present invention with reference to FIG. 4. To compare the embodiment illustrated in FIG. 1 and that in FIG. 4, while the former has one each of D.C. voltage input terminal 8, quarter-wave line 5 and diode 6 connected in series to one another and in parallel between the first and second bypass capacitors 2 and 3, the latter is provided with first, second and third D.C. voltage input terminals 18, 19 and 20, first, second and third quarter-wave lines (hereinafter referred to simply as "lines") 10, 13 and 16, and first, second and third diodes 11, 14 and 17, and one each of D.C. voltage input terminal, line and diode are connected in series, their three sets being inserted in parallel between the first and second bypass capacitors 2 and 3.

Figure 4:
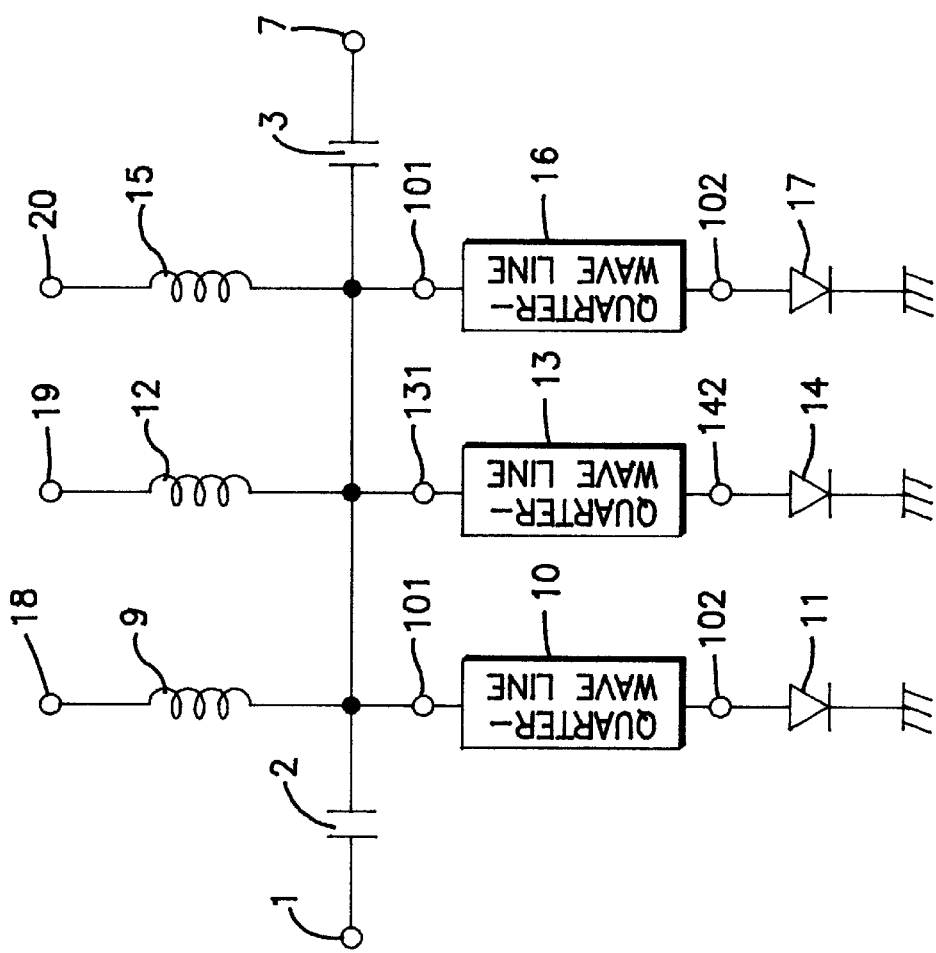
FIG. 4 illustrates another preferred embodiment of the invention, which is an attenuating circuit using quarter-wave lines.

Therefore, the embodiment of FIG. 4 is an attenuating circuit which has a higher attenuation factor, and can attenuate the amplitude of input signals more, than that of FIG. 1.

Now will be described the operation of the circuit of FIG. 4 with reference to FIGS. 5(a) to 5(b) and 6(a) to 6(b).

Figure 5B:
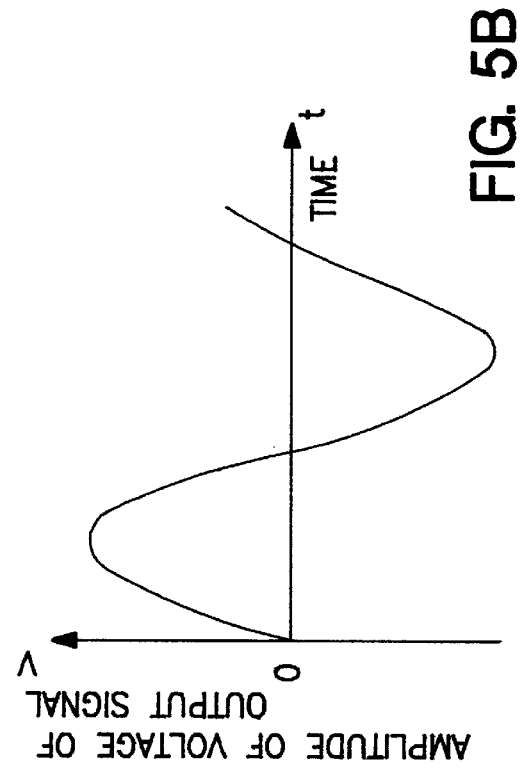
FIGS. 5(a) to 5(b) illustrate the characteristics of the voltage of input/output signals when a D.C. voltage is fed to the attenuating circuit shown in FIG. 4.
Figure 5A:
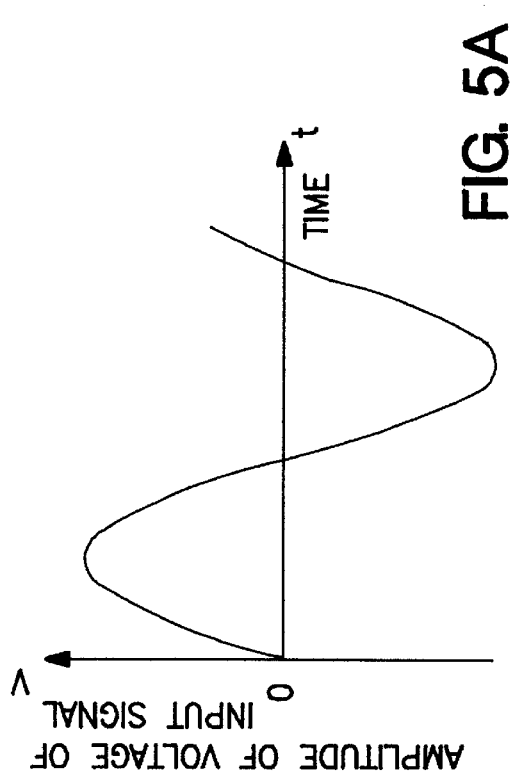

First, as illustrated in FIGS. 5(a) to 5(b), if a D.C. voltage is fed to the first, second and third D.C. voltage input terminals 18, 19 and 20, similarly to the embodiment of FIG. 1, the amplitude of the voltage of the input signals shown in FIG. 5(a) is not attenuated, and output signals shown in FIG. 5(b) are supplied as they are from the output terminal 7.

Figure 6B:
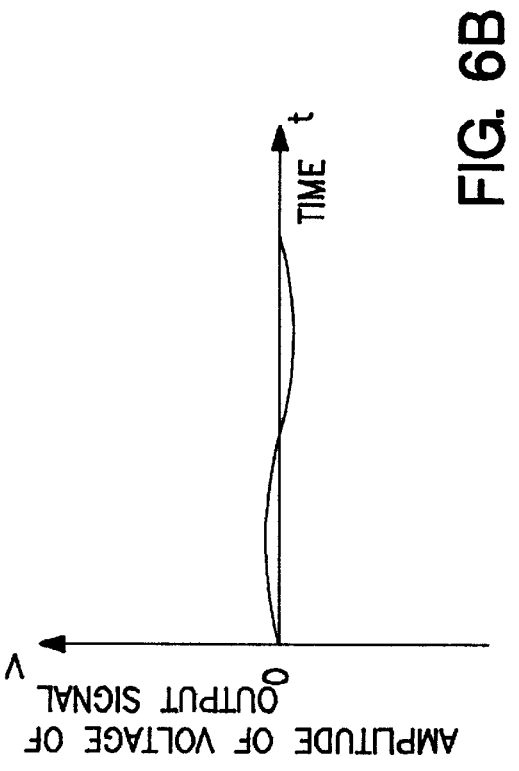
FIGS. 6(a) to 6(b) illustrate the characteristics of the voltage of input/output signals when a D.C. voltage is not fed to the attenuating circuit shown in FIG. 4.
Figure 6A:
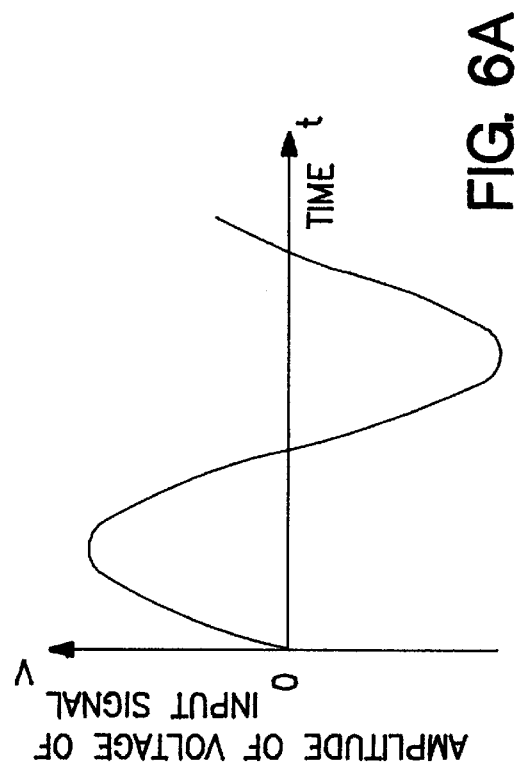

On the other hand, as shown in FIG. 6(a) to 6(b), if no D.C. voltage is fed from the D.C. voltage input terminals 18, 19 and 20, as in the case of the first embodiment, the amplitude of the voltage of input signals shown in FIG. 6(a) is attenuated every time it passes a connecting point between a choke coil and a line, and such output signals as shown in FIG. 6(b) are supplied from the output terminal 7.

Although the two preferred embodiments described above are attenuating circuits in which one or three of D.C. voltage input terminal, choke coil, line and diode are used, the scope of the present invention is never limited to these numbers of elements, but their numbers can be determined otherwise as they suit the required extent of attenuation for the voltage amplitude of input signals.

As hitherto described, the present invention makes it possible for the voltage of input signals to be attenuated without distortion because a quarter-wave line or lines and a diode or diodes are connected in series to the ground and the series-connected circuit or circuits are inserted in parallel between the input and output terminals for signals.

It further enables the operation of the attenuation circuit to be turned on and off by on-off control of the feeding of a D.C. voltage to the series-connected circuit, and can thereby provide a simplified attenuation circuit.

Obviously, numerous additional modifications and variations of the present invention are conceivable in light of the above-explained principles. It is, therefore, to be understood that within the scope of the appended claims, the invention may be practiced otherwise than as specifically described herein.

What is claimed is:

1. An attenuating circuit comprising:
   an A.C. voltage input terminal;
   an A.C. voltage output terminal connected via a common point to said A.C. voltage input terminal;
   a first capacitor, a first end of said first capacitor being connected to said A.C. voltage input terminal, a second end of said first capacitor being connected to said common point;
   a second capacitor, a first end of said second capacitor being connected to said common point, a second end of said second capacitor being connected to said A.C. voltage output terminal;
   a plurality of quarter-wave lines, a first end of each of said plurality of quarter-wave lines being connected to said common point;
   a plurality of D.C. voltage input terminals;
   a plurality of inductors, each of said plurality of inductors being connected to each of said plurality of D.C. voltage input terminals, one by one, an end of each of said plurality of inductors being connected to said common point; and
   a plurality of diodes, an anode of each of said plurality of diodes being connected to a second end of each of said plurality of quarter-wave lines, one by one, a cathode of each of said plurality of diodes being connected to ground.

2. The attenuating circuit, as claimed in claim 1, wherein a natural frequency of said plurality of quarter-wave lines is equal to the frequency of A.C. voltage input signals supplied from said A.C. voltage input terminal.

3. The attenuating circuit, as claimed in claim 1, wherein said A.C. voltage input terminal supplies A.C. voltage input signals to said common point, said A.C. voltage input signals being outputted as they are, if each of said plurality of D.C. voltage input terminals feeds a D.C. voltage to each of said plurality of diodes, one by one, and said A.C. voltage input signals being attenuated, if at least one of said plurality of D.C. voltages is not fed.

* * * * *